United States Patent
Yamada

(10) Patent No.: US 9,888,618 B2
(45) Date of Patent: Feb. 6, 2018

(54) SHIELDED HARNESS AND MANUFACTURING METHOD THEREFOR

(71) Applicant: Yazaki Corporation, Minato-ku, Tokyo (JP)

(72) Inventor: Maki Yamada, Susono (JP)

(73) Assignee: Yazaki Corporation, Minato-ku, Tokyo (JP)

(*) Notice: Subject to any disclaimer, the term of this patent is extended or adjusted under 35 U.S.C. 154(b) by 0 days.

(21) Appl. No.: 14/900,948

(22) PCT Filed: May 29, 2014

(86) PCT No.: PCT/JP2014/064238
§ 371 (c)(1),
(2) Date: Dec. 22, 2015

(87) PCT Pub. No.: WO2014/208260
PCT Pub. Date: Dec. 31, 2014

(65) Prior Publication Data
US 2016/0165765 A1    Jun. 9, 2016

(30) Foreign Application Priority Data
Jun. 27, 2013 (JP) ................. 2013-134787

(51) Int. Cl.
*H01R 4/00* (2006.01)
*H01R 4/50* (2006.01)
(Continued)

(52) U.S. Cl.
CPC ....... *H05K 9/0049* (2013.01); *B60R 16/0207* (2013.01); *B60R 16/0215* (2013.01); *H01B 13/22* (2013.01); *H02G 3/0481* (2013.01)

(58) Field of Classification Search
CPC ........ H02G 3/40; H02G 9/065; H02G 15/068; H02G 15/105; H02G 15/1055; H02G 3/34;
(Continued)

(56) References Cited

U.S. PATENT DOCUMENTS 400,094 A * 3/1889 Limont ............... F16L 9/18
                                                    138/114
2,151,206 A * 3/1939 Hawthorn ........... E21B 17/18
                                                    174/28
(Continued)

FOREIGN PATENT DOCUMENTS

JP    H10-116519 A    5/1998
JP    2004-171952 A   6/2004
(Continued)

OTHER PUBLICATIONS

Definition of "bond" from www.thefreedictionary.com May 24, 2016.*
(Continued)

*Primary Examiner* — Chau N Nguyen
*Assistant Examiner* — Roshn Varghese
(74) *Attorney, Agent, or Firm* — Banner & Witcoff, Ltd.

(57) ABSTRACT

Disclosed is a shielded harness (100) which includes a low-voltage cable (101) and a high-voltage cable (102) to which a voltage higher than that of the low-voltage cable (101) is applied, and into which the low-voltage and the high-voltage cables (101 and 102) are bundled, the shielded harness (100) including: a cylindrical shield member (103) that covers the circumference of the high-voltage cable (102) to form an gap so as to electromagnetically shield; and a cylindrical protective member (104) that covers the circumference of the shield member (103) and the low-voltage
(Continued)

cable (101). The shield member (103) and the protective member (104) are partially bonded or welded together.

7 Claims, 4 Drawing Sheets

(51) Int. Cl.
| | |
|---|---|
| *H02G 15/08* | (2006.01) |
| *H02G 15/02* | (2006.01) |
| *H05K 9/00* | (2006.01) |
| *B60R 16/02* | (2006.01) |
| *H02G 3/04* | (2006.01) |
| *H01B 13/22* | (2006.01) |

(58) Field of Classification Search
CPC .... H02G 3/0616; H01B 11/105; H01B 11/1016; H01B 9/02; H01B 13/22; H01R 13/6581
USPC ............ 174/72 R, 78, 102 R, 103, 361
See application file for complete search history.

(56) References Cited

U.S. PATENT DOCUMENTS

| | | | | |
|---|---|---|---|---|
| 2,585,054 | A * | 2/1952 | Stachura | H01B 11/06 174/36 |
| 3,110,754 | A * | 11/1963 | Witort | H02G 3/0481 174/481 |
| 3,829,602 | A * | 8/1974 | Ishikawa | H01B 7/22 174/102 R |
| 4,611,656 | A * | 9/1986 | Kendall, Jr. | E21B 17/1035 174/102 SP |
| 5,777,273 | A | 7/1998 | Woody et al. | |
| 6,777,616 | B2 * | 8/2004 | Beele | H05K 9/0018 174/140 R |
| 7,075,010 | B2 * | 7/2006 | Santelli, Jr. | H02G 3/0418 174/34 |
| 7,094,970 | B2 | 8/2006 | Kihira | |
| 7,105,746 | B2 | 9/2006 | Shimura | |
| 7,247,795 | B2 * | 7/2007 | Sumi | H01R 24/562 174/74 R |
| 7,918,685 | B1 * | 4/2011 | Kruckenberg | H01B 11/00 174/75 C |
| 2004/0099427 | A1 | 5/2004 | Kihira | |
| 2005/0006127 | A1 | 1/2005 | Shimura | |
| 2010/0045106 | A1 * | 2/2010 | Oga | B60R 16/0215 174/136 |
| 2010/0122831 | A1 * | 5/2010 | Watanabe | H01B 7/426 174/107 |
| 2012/0279776 | A1 * | 11/2012 | Mizutani | H02G 3/0481 174/350 |
| 2012/0305308 | A1 | 12/2012 | Toyama et al. | |
| 2013/0048366 | A1 | 2/2013 | O'Neil | |

FOREIGN PATENT DOCUMENTS

| | | |
|---|---|---|
| JP | 2004-355839 A | 12/2004 |
| JP | 2011-165354 A | 8/2011 |
| JP | 2012-134367 A | 7/2012 |

OTHER PUBLICATIONS

Jan. 7, 2016—(WO) IPRP—App PCT/JP2014/064238.
Sep. 2, 2014—International Search Report—Intl App PCT/JP2014/064238.

* cited by examiner

SHIELDED HARNESS AND MANUFACTURING METHOD THEREFOR

TECHNICAL FIELD

The present invention relates to a shielded harness and a manufacturing method therefor.

BACKGROUND ART

In recent years, in the automotive industry, the transition from gasoline vehicles to electric vehicles have been examined, and various high-voltage cables have been suggested. It is necessary to ensure the shielding properties of the high-voltage cables. For this reason, the shielding properties of a harness including high-voltage cables are ensured by covering each of the high-voltage cables with a conductive braid, collectively covering a bundle of the high-voltage cables with an insulator using an extrusion molding method, and putting the bundled high-voltage cables into an exterior member such as a corrugated tube (refer to PTL 1).

In a harness disclosed in PTL 1, each of the high-voltage cables has to be covered with a braid. This causes an increase in the number of steps and the number of components used during manufacturing.

As a result, a shielded harness including cylindrical shielding means for collectively surrounding a plurality of electrical wires has been proposed. In this shielded harness, the plurality of electrical wires are collectively surrounded by the shielding means, and thus a step of covering each of the electrical wires with a braid is not required, and it is possible to limit an increase in the number of steps and the number of components used during manufacturing (refer to PTL 2).

CITATION LIST

Patent Literature

[PTL 1] JP-A-10-116519
[PTL 2] JP-A-2004-171952

SUMMARY OF INVENTION

Technical Problem

Meanwhile, in the shielded harness disclosed in PTL 2, the plurality of electrical wires are collectively surrounded by the shielding means, and thus it is possible to prevent the high-voltage cables from adversely affecting external devices and the like outside of the shielded harness; however, interference between the high-voltage cables and other electrical wires inside the shielding means cannot be prevented.

The present invention is made to solve these problems of the related art, and an object of the present invention is to provide a shielded harness and a manufacturing method thereof which is capable of appropriately shielding high-voltage cables, and a manufacturing method of the shielded harness which is capable of limiting an increase in the number of steps and the number of components used during manufacturing.

Solution to Problem

The object of the present invention is achieved by the following configuration.

(1) A shielded harness which includes a low-voltage cable formed of one or a plurality of electrical wires, and a high-voltage cable which is formed of one or a plurality of electrical wires and to which a voltage higher than that of the low-voltage cable is applied, and in which the cables are bundled, the shielded harness comprising:

a cylindrical shield member that covers a circumference of the high-voltage cable with a gap so as to electromagnetically shield; and a cylindrical protective member that covers a circumference of the shield member and the low-voltage cable, wherein the shield member and the protective member are partially bonded or welded together.

Bonding is performed using a solvent or a hot melt such as a bonding agent, or a double-sided tape. Fusion is thermal fusion or the like. In addition, the concept of bonding includes a case in which the shield member and the protective member are joined together by disposing the shield member on the inside of the protective member and along the protective member when the protective member is formed from a crosshead or the like using an extrusion molding method.

The shielded harness with the configuration described in (1) includes the shield member that covers the circumference of the high-voltage cable to form an gap, and shields electromagnetic waves from the high-voltage cable, and the cylindrical protective member that covers the circumference of the shield member and the low-voltage cable. For this reason, in the manufacturing of the shielded harness, a manufacturer may insert the high-voltage cable into the shield member, and insert the low-voltage cable into the protective member in such a way that the low-voltage cable is disposed outside of the shield member. The shielded harness is configured such that the circumference of the high-voltage cable is covered with the shield member, and thus it is not necessary to cover the high-voltage cable with a braid or the like, and it is possible to limit an increase in the number of steps and an increase in the number of components used during manufacturing. The cylindrical shield member is bonded or welded to the inside of the protective member, and thus it is possible to appropriately shield the high-voltage cable without causing a problem, such as the shield member being misaligned with the protective member when the high-voltage cable or the low-voltage cable is inserted into the shielded harness. As a result, it is possible to limit an increase in the number of steps and the number of components used during manufacturing, and to appropriately shield the high-voltage cables.

(2) The shielded harness described in (1), which is routed along a vehicle-body underfloor that is outside of a vehicle body frame.

The shielded harness with the configuration described in (2) is routed along the vehicle-body under floor which is present outside of the vehicle body frame. Therefore, due to the expected popularization of electric vehicles or hybrid vehicles in the future, it is possible to provide a underfloor shielded harness which is suitable when the high-voltage cable connecting a battery and an inverter together, and the low-voltage cable supplying electrical power to various devices from a low-voltage battery having a voltage of 12 V are routed on the under floor while being parallel to each other.

(3) A method of manufacturing a shielded harness, the method comprising:

a first step of bonding or welding a cylindrical shield member for electromagnetic shielding to inside of a cylindrical protective member; and a second step of inserting a low-voltage cable formed of one or a plurality of electrical wires into outside of the shield member bonded or welded in the first step, and inserting a high-voltage cable formed of one or a plurality of electrical wires into inside of the shield member, wherein a voltage higher than that of the low-voltage cable is applied to the high-voltage cable.

According to the method of manufacturing the shielded harness with the configuration described in (3), the cylindrical shield member for electromagnetic shielding is bonded or welded to the inside of the cylindrical protective member, the low-voltage cable is inserted into the protective member in such a way as to be disposed outside of the shield member, and the high-voltage cable is inserted into the shield member. For this reason, the circumference of the high-voltage cable is covered with the shield member, and thus it is not necessary to cover the high-voltage cable with a braid or the like. It is possible to limit an increase in the number of steps and in the number of components used during manufacturing. The cylindrical shield member is bonded to the inside of the protective member, and thus it is possible to appropriately shield the high-voltage cable without causing such a problem that the shield member is misaligned with the protective member when the high-voltage cable or the low-voltage cable is inserted into the shielded harness. As a result, it is possible to limit an increase in the number of steps and the number of components used during manufacturing, and to appropriately shield the high-voltage cables.

Advantageous Effects of Invention

According to the present invention, it is possible to provide a shielded harness which is capable of appropriately shielding high-voltage cables, and a manufacturing method of the shielded harness which is capable of limiting an increase in the number of steps and the number of components used during manufacturing.

BRIEF DESCRIPTION OF DRAWINGS

FIG. 3(a) illustrates a first example, and FIG. 3(b) illustrates a second example.

FIG. 4(a) illustrates a first example, and FIG. 4(b) illustrates a second example.

DESCRIPTION OF EMBODIMENTS

Hereinafter, a preferred embodiment of the present invention will be described with reference to the accompanying drawings. In a description to be given hereinbelow, a shielded harness in the embodiment is an underfloor shielded harness, but the shielded harness is not limited to the underfloor shielded harness, and may be shielded harnesses that are provided at other locations.

Figure 1:
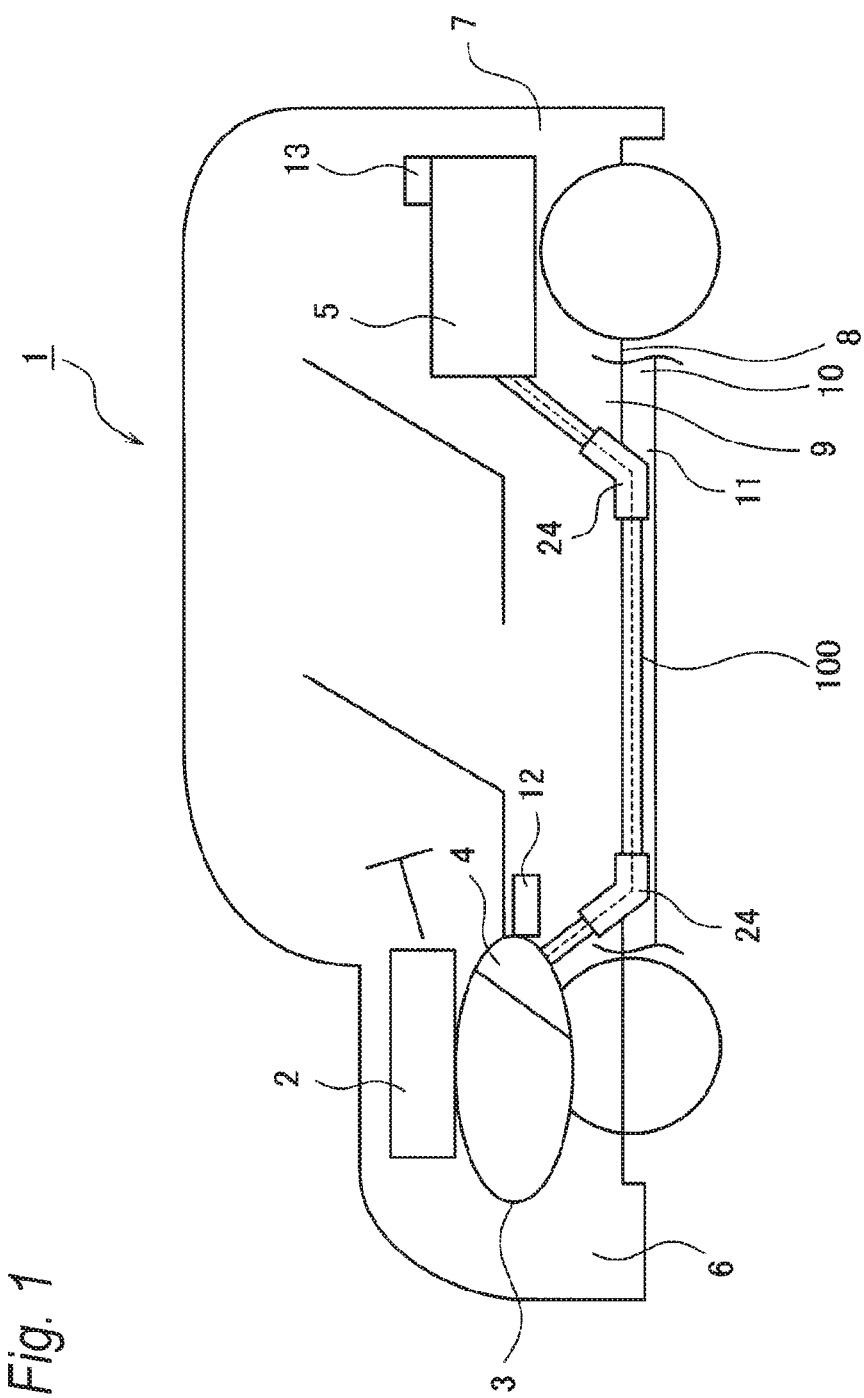
FIG. 1 is a schematic view illustrating a vehicle in which an underfloor shielded harness in an embodiment of the present invention is routed.

FIG. 1 is a schematic view illustrating a vehicle in which the underfloor shielded harness in the embodiment of the present invention is routed. As illustrated in FIG. 1, a vehicle 1 is a hybrid vehicle that is driven by two power sources, that is, an engine 2 and a motor 3. Electric power is supplied from a battery 5 to the motor 3 via an inverter 4. The engine 2, the motor 3, and the inverter 4 are mounted on a vehicle-interior front side 6 on which the front wheels and the like are present. The battery 5 is mounted on a vehicle-interior rear side 7 on which the rear wheels and the like are present.

In FIG. 1, a vehicle-body upper floor 9 is illustrated on an upper side of a vehicle body frame 8. A vehicle-body under floor 10 is illustrated on a lower side of the vehicle body frame 8. A reinforcement 11 having a substantially convex shaped section is provided on the vehicle-body under floor 10 so as to increase the strength of the vehicle. The reinforcement 11 is formed in such a way as to extend in a longitudinal direction of the vehicle. An electrical connection box 12 such as a relay box is provided on the vehicle-interior front side 6. A low-voltage battery 13 is provided on the vehicle-interior rear side 7.

In the embodiment, the motor 3 is configured to include both a motor and a generator. The inverter 4 is configured to include both an inverter and a converter. The inverter 4 is an inverter assembly, and includes an air-conditioner inverter, a generator inverter, a motor inverter, and the like. The battery 5 is a Li-ion battery, and is configured such that the battery 5 can be charged through an external outlet of a domestic power source or the like. The battery 5 is built as a module into which various functional components (not illustrated) are assembled.

In the vehicle 1, an underfloor shielded harness 100 is provided to connect the inverter 4 and the battery 5 together.

Figure 2:
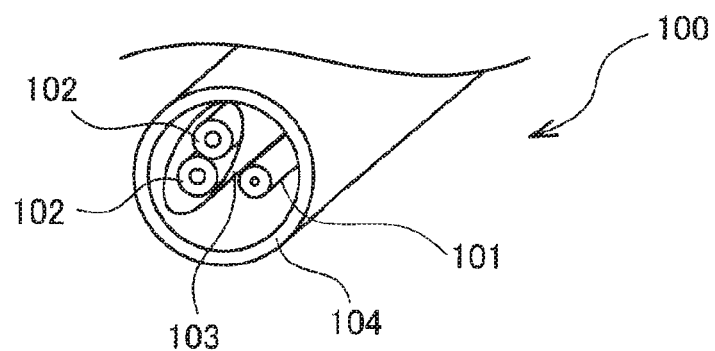
FIG. 2 is a schematic enlarged view illustrating the underfloor shielded harness illustrated in FIG. 1.

FIG. 2 is a schematic enlarged view illustrating the underfloor shielded harness 100 illustrated in FIG. 1. As illustrated in FIG. 2, the underfloor shielded harness 100 is routed in a state where the underfloor shielded harness 100 is fixed to the vehicle-body under floor 10, which is present outside of the vehicle body frame 8, using a fixing member 24 (refer to FIG. 1). The underfloor shielded harness 100 includes a low-voltage cable 101 and a high-voltage cable 102.

Electrical power is supplied to various devices from the low-voltage battery 13 via the low-voltage cable 101. A voltage higher than that of the low-voltage cable 101 is applied to the high-voltage cable 102, and as described above, connects the inverter 4 and the battery 5 together. In FIG. 2, one low-voltage cable 101 is configured in the underfloor shielded harness 100; however, a plurality of the low-voltage cables 101 may be configured therein. In FIG. 2, two high-voltage cables 102 are configured therein; however, one high-voltage cable 102 may be configured therein, or three or more high-voltage cables 102 may be configured therein.

Each of the low-voltage cable 101 and the high-voltage cable 102 is configured to include a conductor and an insulator that covers the conductor. Copper, aluminum, or an alloy thereof is used as a conductor material. Examples of an insulator material of the low-voltage cable 101 include polyethylene; cross-linked polyethylene; polypropylene; vinyl chloride; fluorine; polybutylene terephthalate; polyethylene terephthalate; and elastomer. Examples of an insulator material of the high-voltage cable 102 include polyethylene; cross-linked polyethylene; polypropylene; vinyl chloride; polybutylene terephthalate; polyethylene terephthalate; and elastomer.

In the embodiment, the underfloor shielded harness 100 includes a shield member 103 and a protective member 104. The shield member 103 covers the circumference of the high-voltage cables 102 to form a gap, and shields electromagnetic waves from the high-voltage cables 102. The shield member 103 is formed in a long cylindrical shape. The shield member 103 is made of a conductive metallic mesh, conductive cloth, a braid, or a metallic foil, and examples of a metal used include copper, a copper alloy, silver, aluminum, an aluminum alloy, and nickel. A metallic mesh, conductive cloth, a braid, and a metallic foil may be a shield member manufactured by applying the metallic mesh to a fabric.

Figure 3:
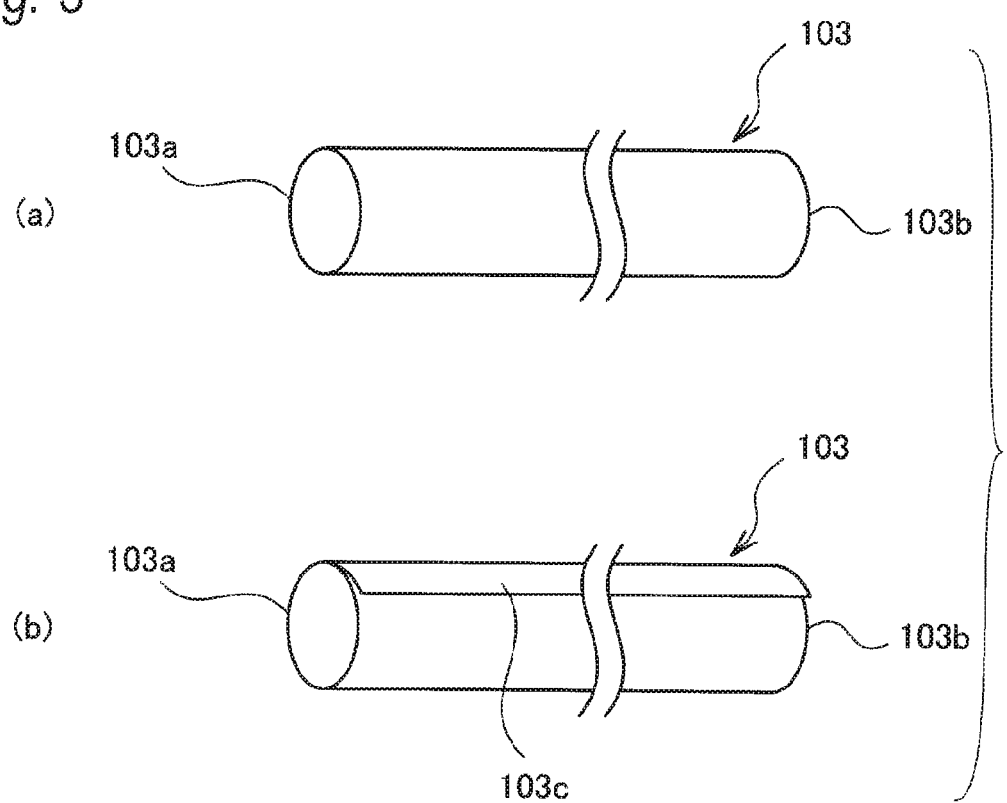
FIG. 3 shows perspective views illustrating the configuration of a shield member illustrated in FIG. 2.

FIG. 3 shows perspective views illustrating the configuration of the shield member 103 illustrated in FIG. 2, FIG. 3(a) illustrates a first example, and FIG. 3(b) illustrates a second example. As illustrated in FIG. 3(a), the shield member 103 is formed in a complete cylindrical shape having both open end portions 103a and 103b in a longitudinal direction of the low-voltage cable 101 and the high-voltage cable 102. As illustrated in FIG. 3(b), the shield member 103 may include a side end portion 103c that protrudes when a cylindrical shape is formed by rolling up a long sheet-like member. Insofar as the shield member 103 has a cylindrical portion capable of accommodating the high-voltage cables 102, the shape and the configuration of the shield member 103 are not limited to specific shape and configuration.

The protective member 104 is a cylindrical protective member that covers the circumference of the low-voltage cable 101, and the shield member 103 covering the high-voltage cables 102. The protective member 104 is a corrugated tube, a shrinkable tube, a rubber tube, or the like. Examples of the material include polypropylene, polyamide, rubber, TPEE, fluororesin, and elastomer. The protective member 104 may be made of metal such as aluminum, iron, and nickel. For the view point of the routing of the low-voltage cable 101 and the high-voltage cables 102, desirably, the protective member 104 is formed as a tube in which flexible portions (which can be bent at 90 degrees or the like) and portions (which has rigidity higher than that of the flexible portions, and cannot be bent at 90 degrees or the like) are alternately formed.

Similar to the shield member 103 illustrated in FIG. 3(a), the protective member 104 may be pre-formed in the shape of a complete cylinder, or similar to the shield member 103 illustrated in FIG. 3(b), the cylindrical shape of the protective member 104 may be formed by rolling up a sheet-like protective member.

The shield member 103 and the protective member 104 are partially bonded together using a solvent or a hot melt such as a bonding agent, or a tape-like bonding member such as a double-sided tape. The shield member 103 and the protective member 104 may be partially welded together by heat. Examples of the bonding agent include a bonding-material thermosetting resin bonding agent, a thermoplastic resin bonding agent, and a hot melt bonding agent.

Figure 4:
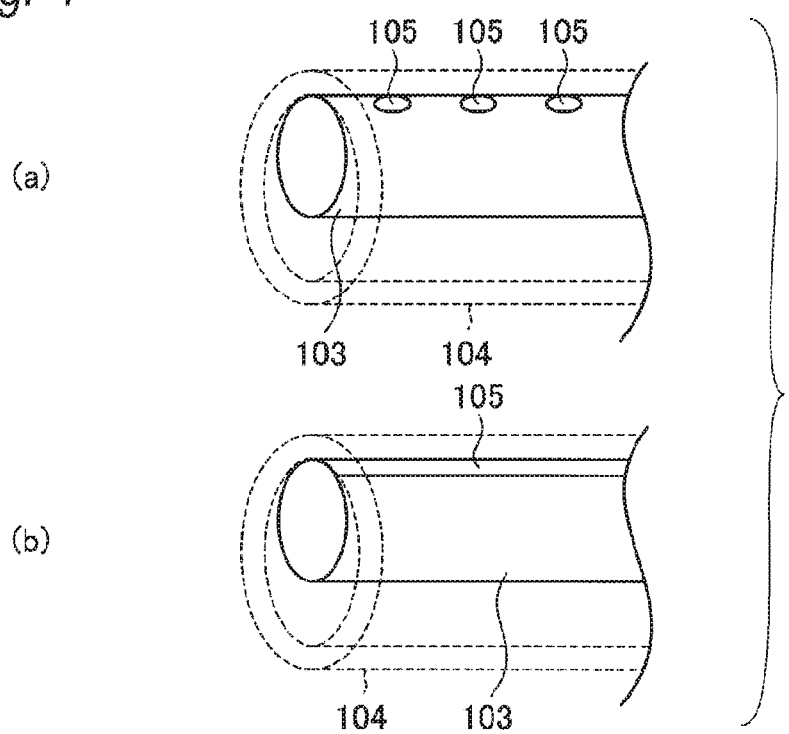
FIG. 4 shows perspective views illustrating a state in which the shield member and a protective member illustrated in FIG. 2 are bonded together using a bonding agent.

FIG. 4 shows perspective views illustrating a state in which the shield member 103 and the protective member 104 illustrated in FIG. 2 are bonded together using a bonding agent, FIG. 4(a) illustrates a first example, and FIG. 4(b) illustrates a second example.

As illustrated in FIG. 4(a), bonding agents 105 are linearly and intermittently applied to the outside of the shield member 103 or the inside of the protective member 104 along the longitudinal direction, and the bonding agents 104 are continuously present in a dot pattern. As illustrated in FIG. 4(b), the bonding agent 105 is linearly and continuously applied to the outside of the shield member 103 or the inside of the protective member 104 along the longitudinal direction, and the bonding agent 105 may be continuously present in a discontinued-line pattern. Insofar as the shield member 103 and the protective member 104 are bonded together, the positions of application of the bonding agent 105 are not limited to specific positions.

In this configuration, when the underfloor shielded harness 100 is manufactured, the shield member 103 and the protective member 104 are bonded together. After a bonded body is manufactured, the high-voltage cables 102 are inserted into the shield member 103, and the low-voltage cable 101 may be inserted into the protective member 104 in such a way as to be disposed outside of the shield member 103. The underfloor shielded harness 100 is configured such that the circumference of the high-voltage cables 102 are covered with the shield member 103, and thus it is not necessary to cover each of the high-voltage cables 102 with a braid or the like, and it is possible to limit an increase in the number of steps and the number of components used during manufacturing. The cylindrical shield member 103 is bonded to the inside of the protective member 104, and thus it is possible to appropriately shield the high-voltage cables 102 without causing such a problem that the shield member 103 is misaligned with the protective member 104 when the high-voltage cables 102 or the low-voltage cable 101 are inserted into the underfloor shielded harness 100.

In FIGS. 4(a) and 4(b), examples of bonding using the bonding agent 105 are illustrated; however, the present invention is not limited to these examples, and the shield member 103 and the protective member 104 may be bonded together using a solvent, a hot melt, or a double-sided tape which has bonding properties. Alternatively, the shield member 103 and the protective member 104 may be welded together by heat.

Figure 5:
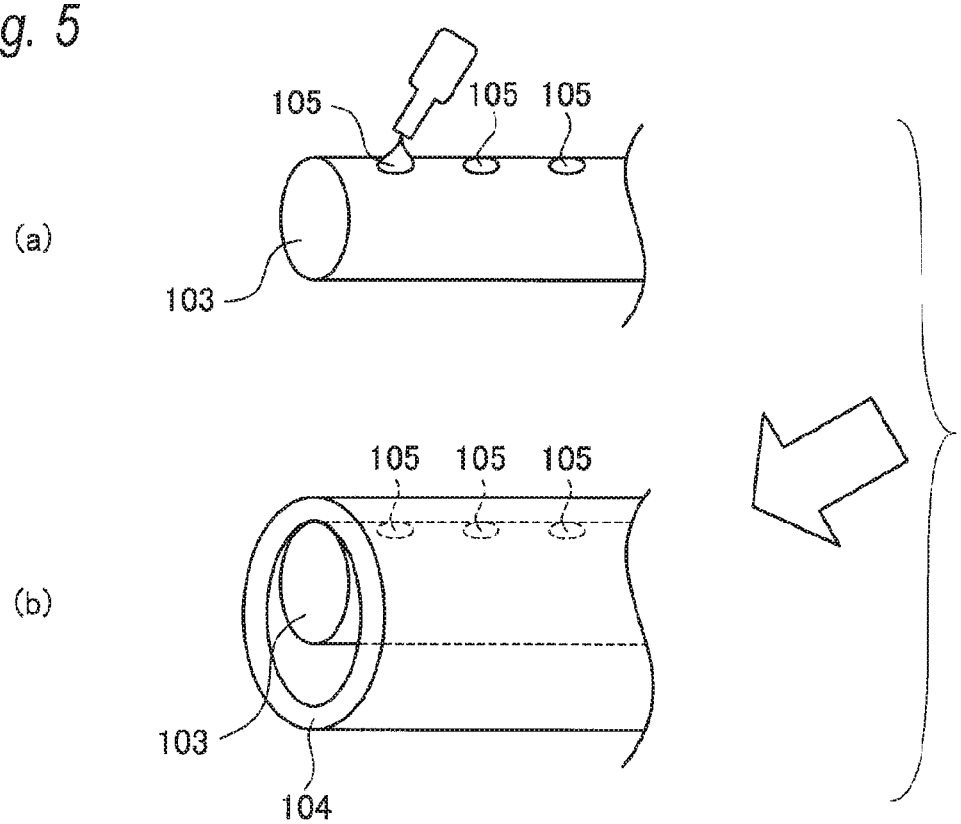
FIGS. 5(a) and 5(b) are process views illustrating an example of a method of manufacturing the underfloor shielded harness in the embodiment.

Hereinafter, an example of a method of manufacturing the underfloor shielded harness 100 in the embodiment will be described. FIGS. 5(a) and 5(b) are process views illustrating an example of the method of manufacturing the underfloor shielded harness 100 in the embodiment. As illustrated in FIG. 5(a), first, an operator prepares the cylindrical shield member 103, and intermittently applies the thermoplastic bonding agent 105 to the shield member 103 along the longitudinal direction. The shield member 103 is prepared to have such an internal space area as to allow the high-voltage cables 102 to be inserted thereinto in a subsequent step.

Subsequently, the shield member 103 is inserted into the protective member 104, and the portions of the shield member 103, to which the bonding agent 105 is applied, are brought into contact with an inner wall of the protective member 104. The operator heats the protective member 104 in a direction of the white arrow in FIG. 5(b) such that the bonding agent 105 is melted, and the shield member 103 and the protective member 104 are bonded together.

Thereafter, the operator inserts the high-voltage cables 102 into the shield member 103. The operator inserts the low-voltage cable 101 into the protective member 104 in such a way that the low-voltage cable 101 is outside of the shield member 103. Accordingly, it is possible to obtain the underfloor shielded harness 100 illustrated in FIG. 2.

In FIGS. 5(a) and 5(b), an example of the manufacturing method using the bonding agent 105 is illustrated; however, the present invention is not limited to this manufacturing method, and the shield member 103 and the protective member 104 may be bonded together using a double-sided tape. Alternatively, the shield member 103 and the protective member 104 may be welded together by heat. Specifically, a manufacturing method to be described hereinbelow may be adopted.

Figure 6:
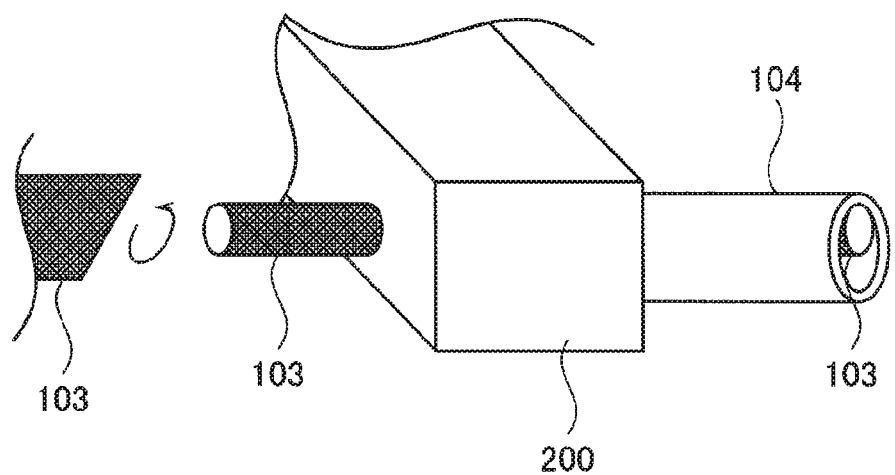
FIG. 6 is a view illustrating another example of the method of manufacturing the underfloor shielded harness in the embodiment.

FIG. 6 is a view illustrating another example of the method of manufacturing the underfloor shielded harness 100 in the embodiment. As illustrated in FIG. 6, first, the sheet-like shield member 103 is supplied to a crosshead 200. At this time, the sheet-like shield member 103 reaches the crosshead 200 while being gradually rolled up.

The shield member 103 is disposed on the inside of the protective member 104 and along the protective member 104 when the cylindrical protective member 104 is formed from the crosshead 200 using an extrusion molding method. During this process, the shield member 103 and the protective member 104 are joined together. In the embodiment, the joining is a concept of bonding.

Thereafter, the high-voltage cables 102 are inserted into the shield member 103, and the low-voltage cable 101 is inserted into the protective member 104 in such a way as to be disposed outside of the shield member 103. Accordingly, it is possible to obtain the underfloor shielded harness 100 illustrated in FIG. 2.

As such, the underfloor shielded harness 100 in the embodiment includes the shield member 103 that covers the circumference of the high-voltage cables 102 to form a gap, and shields electromagnetic waves from the high-voltage cables 102, and the cylindrical protective member 104 that covers the circumference of the shield member 103 and the low-voltage cable 101. For this reason, in the manufacturing of the underfloor shielded harness 100, a manufacturer may insert the high-voltage cables 102 into the shield member 103, and insert the low-voltage cable 101 into the protective member 104 in such a way that the low-voltage cable 101 is disposed outside of the shield member 103. The underfloor shielded harness 100 is configured such that the circumference of the high-voltage cables 102 is covered with the shield member 103, and thus it is not necessary to cover each of the high-voltage cables 102 with a braid or the like, and it is possible to limit an increase in the number of steps and an increase in the number of components used during manufacturing. The cylindrical shield member 103 is bonded to the inside of the protective member 104, and thus it is possible to appropriately shield the high-voltage cables 102 without causing such a problem that the shield member 103 is misaligned with the protective member 104 when the high-voltage cables 102 or the low-voltage cable 101 are inserted into the underfloor shielded harness 100. As a result, it is possible to limit an increase in the number of steps and the number of components used during manufacturing, and to appropriately shield the high-voltage cables 102.

The underfloor shielded harness 100 in the embodiment is routed along the vehicle-body under floor 10 which is present outside of the vehicle body frame 8. Therefore, due to the expected popularization of electric vehicles or hybrid vehicles in the future, when the high-voltage cables 102 connecting the battery 5 and the inverter 4 together, and the low-voltage cable 101 supplying electrical power to various devices from the low-voltage battery having a voltage of 12 V are routed on the under floor while being parallel to each other, it is possible to provide the suitable underfloor shielded harness 100.

According to the method of manufacturing the underfloor shielded harness 100 in the embodiment, the cylindrical shield member 103 for electromagnetic shielding is bonded or welded to the inside of the cylindrical protective member 104, the low-voltage cable 101 is inserted into the protective member 104 in such a way as to be disposed outside of the shield member 103, and the high-voltage cables 102 are inserted into the shield member 103. For this reason, the circumference of the high-voltage cables 102 is covered with the shield member 103, and thus it is not necessary to cover each of the high-voltage cables 102 with a braid or the like, and it is possible to limit an increase in the number of steps and in the number of components used during manufacturing. The cylindrical shield member 103 is bonded to the inside of the protective member 104, and thus it is possible to appropriately shield the high-voltage cables 102 without causing such a problem that the shield member 103 is misaligned with the protective member 104 when the high-voltage cables 102 or the low-voltage cable 101 are inserted into the underfloor shielded harness 100. As a result, it is possible to limit an increase in the number of steps and the number of components used during manufacturing, and to appropriately shield the high-voltage cables 102.

In addition, according to this manufacturing method, only the bonding or the welding of the shield member 103 to the cylindrical protective member 104 is performed at a factory or the like, and when the underfloor shielded harness 100 is routed in the field, the low-voltage cable 101 and the high-voltage cables 102 may be inserted thereinto, and it is not necessary to perform the entirety of the steps at the factory.

The present invention has been described in detail with reference to the specific embodiment; however, the present invention is not limited to this embodiment, and modifications can be made to the present invention insofar as the modifications do not depart from the purport of the present invention. In the embodiment, the material, the shape, the dimensions, and the disposition location of each configuration element, the number of configuration elements, and the like are arbitrarily defined, and the present invention is not limited to those in the embodiment insofar as the present invention can be achieved.

In the embodiment, the underfloor shielded harness 100 is exemplified as a shielded harness, and the shielded harness is not limited to the underfloor shielded harness. The shielded harness of the present invention may be provided at locations other than the under floor.

Each of the shield member 103 and the protective member 104 has a circular section, an elliptical section, or the like; however, the present invention is not limited to those sectional shapes, and each of the shield member 103 and the protective member 104 may have a polygonal section such as a substantially quadrilateral section.

The sheet-like shield member 103 and the sheet-like protective member 104 are partially bonded together or welded together while the sheet-like shield member 103 is stacked on the sheet-like protective member 104. Thereafter, the sheet-like shield member 103 is rolled up, the sheet-like protective member 104 is rolled up, and then the low-voltage cable 101 and the high-voltage cables 102 may be inserted thereinto.

The characteristics of the shielded harness and the manufacturing method thereof in the embodiments of the present invention are collectively and briefly listed in (1) to (3) hereinbelow.

(1) A shielded harness (an underfloor shielded harness 100) which includes a low-voltage cable (101) formed of one or a plurality of electrical wires, and a high-voltage cable (102) which is formed of one or a plurality of electrical wires and to which a voltage higher than that of the low-voltage cable (101) is applied, and into which the cables (101 and 102) are bundled, the shielded harness (the underfloor shielded harness 100) including:

a cylindrical shield member (103) that covers the circumference of the high-voltage cable (102) with gap so as to electromagnetically shield; and a cylindrical protective member (104) that covers the circumference of the shield member (103) and the low-voltage cable (101), wherein the shield member (103) and the protective member (104) are partially bonded or welded together.

(2) The shielded harness (the underfloor shielded harness 100) described in (1) is routed along a vehicle-body under floor (10) which is outside of a vehicle body frame (8).

(3) A method of manufacturing a shielded harness (an underfloor shielded harness 100), the method including:

a first step of bonding or welding a cylindrical shield member (103) for electromagnetic shielding to inside of a cylindrical protective member (104); and a second step of inserting a low-voltage cable (101) formed of one or a plurality of electrical wires into outside of the shield member (103) bonded or welded in the first step, and inserting a high-voltage cable (102) formed of one or a plurality of electrical wires into inside of the shield member (103), wherein a voltage higher than that of the low-voltage cable (101) is applied to the high-voltage cable (102).

This application is claimed based on Japanese Patent Application No. 2013-134787, filed on Jun. 27, 2013, the content of which is incorporated herein for reference.

INDUSTRIAL APPLICABILITY

According to the present invention, it is possible to provide a shielded harness which is capable of appropriately shielding high-voltage cables, and a manufacturing method of a shielded harness which is capable of limiting an increase in the number of steps and the number of components used during manufacturing.

REFERENCE SIGNS LIST

100: UNDERFLOOR SHIELDED HARNESS
101: LOW-VOLTAGE CABLE
102: HIGH-VOLTAGE CABLE
103: SHIELD MEMBER
103a, 103b: OPEN END PORTION
103c: SIDE END PORTION
104: PROTECTIVE MEMBER
105: BONDING AGENT

The invention claimed is:

1. A shielded harness which includes, the shielded harness comprising:
 a low-voltage cable formed of one or a plurality of electrical wires;
 a high-voltage cable formed of one or a plurality of electrical wires and to which a voltage higher than that of the low-voltage cable is applied, so that the low-voltage and high-voltage cables are bundled in the shielded harness;
 a cylindrical shield member that covers a circumference of the high-voltage cable with a gap so as to electromagnetically shield the high-voltage cable, the low-voltage cable being disposed outside of the cylindrical shield member; and
 a cylindrical protective member that covers a circumference of the shield member and the low-voltage cable,
 wherein an outer peripheral surface of the shield member and an inner peripheral surface of the protective member are partially bonded or welded to one another parallel to a longitudinal direction of the shield member in a dot pattern, wherein the low-voltage cable and the high-voltage cable extend in the longitudinal direction.

2. The shielded harness described in claim 1, wherein the shielded harness is routed along a vehicle-body underfloor that is outside of a vehicle body frame.

3. The shielded harness of claim 1, wherein shield member is disposed closer to a first portion of the protective member in a radial direction of the protective member than to a second portion of the protective member, the first portion being opposite to the second portion of the protective member in the radial direction, and
 wherein the shield member is bonded or welded to the first portion of the protective member but not to the second portion of the protective member.

4. The shielded harness of claim 3, wherein the shield member is separately formed from the protective member using a different material.

5. The shielded harness of claim 1, wherein the low-voltage cable is only covered by the protective member, the protective member being physically distinct from the shield member.

6. A method of manufacturing a shielded harness, the method comprising:
 a step of inserting a cylindrical shield member for electromagnetic shielding inside of a cylindrical protective member;
 a step of bonding or welding an outer peripheral surface of the cylindrical shield member and an inner peripheral surface of the cylindrical protective member at multiple points, the multiple points disposed on an imaginary line parallel to a longitudinal direction in which the shield member extends; and
 a step of inserting a low-voltage cable formed of one or a plurality of electrical wires into an area outside of the shield member bonded or welded in the step of bonding or welding, and inserting a high-voltage cable formed of one or a plurality of electrical wires into inside of the shield member, wherein a voltage higher than that of the low-voltage cable is applied to the high-voltage cable,
 wherein, in the step of bonding or welding, the outer peripheral surface of the shield member and the inner peripheral surface of the protective member are partially bonded or welded to one another parallel to the longitudinal direction of the shield member in a dot pattern.

7. The shielded harness of claim 6, wherein the shield member is separately formed from the protective member using a different material.

* * * * *